United States Patent [19]

Tenenbaum et al.

[11] Patent Number: 5,144,231
[45] Date of Patent: Sep. 1, 1992

[54] EDDY CURRENT DETECTOR FOR DETECTING AN OBJECT WITH OFFSET COMPENSATION

[76] Inventors: Jeffrey Tenenbaum, P.O. Box 490, Southfield, Mich. 48037; Peter A. Hochstein, 2966 River Valley Dr., Troy, Mich. 48098; Teiji Okuyama, 533 Oak, Birmingham, Mich. 48009

[21] Appl. No.: 688,710

[22] Filed: Apr. 23, 1991

Related U.S. Application Data

[63] Continuation of Ser. No. 252,794, Sep. 30, 1988, abandoned.

[51] Int. Cl.[5] .................... G01P 3/49; G01P 3/489; H03D 1/04; H03H 17/00
[52] U.S. Cl. .................................... 324/164; 324/166; 324/207.12; 324/207.25; 324/225; 328/5; 328/167; 329/349; 364/565; 364/571.01; 364/572
[58] Field of Search ............... 324/163, 164, 166, 173, 324/174, 207.12, 207.16, 207.25, 225, 234, 236, 237, 239; 328/165–167, 1, 5; 364/565, 571.01, 572–574; 329/349, 351, 353; 361/236, 239

[56] References Cited

U.S. PATENT DOCUMENTS

| | | | |
|---|---|---|---|
| 3,394,303 | 7/1968 | Cressman et al. | 324/225 |
| 3,611,120 | 10/1971 | Forster | 324/225 |
| 3,715,659 | 2/1973 | Abnett et al. | 324/243 |
| 3,776,606 | 12/1973 | Emerson | 324/166 X |
| 3,934,200 | 1/1976 | Schoonover et al. | 324/164 X |
| 4,142,153 | 2/1979 | Smith | 324/166 X |
| 4,263,551 | 4/1981 | Gregory et al. | 324/233 |
| 4,331,920 | 5/1982 | Kalisch et al. | 324/225 |
| 4,341,996 | 7/1982 | Coffman | 324/166 X |
| 4,465,976 | 8/1984 | Avery et al. | 324/251 |
| 4,473,799 | 9/1984 | Favre | 324/236 |
| 4,543,527 | 9/1985 | Schuchmann et al. | 324/207 |
| 4,556,846 | 12/1985 | D'Hondt | 324/225 X |
| 4,574,237 | 3/1986 | Hachtel et al. | 324/173 |
| 4,605,889 | 8/1986 | Luneau | 324/163 X |
| 4,647,853 | 3/1987 | Cobern | 324/173 |
| 4,678,992 | 7/1987 | Hametta | 324/207.25 |
| 4,761,609 | 8/1988 | Dorman et al. | 324/164 X |
| 4,799,011 | 1/1989 | Muller | 324/237 X |
| 4,875,007 | 10/1989 | Ginns | 324/236 |

FOREIGN PATENT DOCUMENTS

| | | | |
|---|---|---|---|
| 0121110 | 9/1980 | Japan | 324/208 |
| 2107470 | 4/1983 | United Kingdom | 324/163 |

*Primary Examiner*—Gerard R. Strecker
*Attorney, Agent, or Firm*—Banner, Birch, McKie & Beckett

[57] ABSTRACT

An RF oscillator induces eddy currents to be measured in an object. An eddy current probe senses alterations, such as teeth on a disc, for example, in the object which are represented as eddy current signals sensed by an eddy current probe. The present invention separates alteration current signals from offset currents in the eddy current signal to aid in discriminating levels in the alteration current signals. The alteration currents are separated from the offset currents by AC coupling with a high pass filter or separated by a microprocessor as part of a data processing detection routine.

6 Claims, 7 Drawing Sheets

EDDY CURRENT DETECTOR FOR DETECTING AN OBJECT WITH OFFSET COMPENSATION

This application is a continuation of application Ser. No. 252,794, filed Sep. 30, 1988, now abandoned.

BACKGROUND OF THE INVENTION

1. Technical Field

The present invention generally relates to the field of electronic measuring devices and more particularly, is directed to a device for measuring the rate of rotation of an object without being adversely affected by environmental conditions, improper alignment and spacing with the object being measured or a change in internal component values due to temperature drift and aging.

2. Related Art

Figure 1:
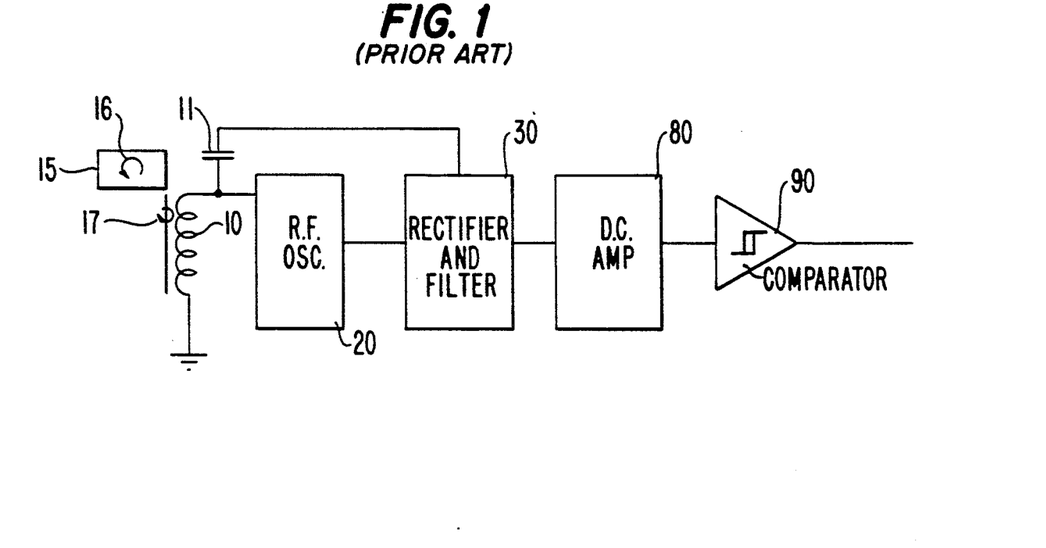
FIG. 1 is a schematic block diagram of a conventional eddy current detector.

Conventional rotation detectors and measuring devices utilize eddy current probes. Such probes are well known for their ability to detect the presence of ferrous and nonferrous conductors. Such probes generally operate by inducing radio frequency (RF) energy in metals adjacent the sensing probe and then monitoring the excitation voltage at the sensing probe. An example of such a probe is illustrated in FIG. 1 where RF energy from oscillator 20 is induced in metal object 15 by sensing probe 10. The energy induced in object 15 is known as eddy currents 16 and results in a decrease in excitation voltage at sensing probe 10. In a simple switching application where detection of the presence or absence of the object is all that is required, the excitation voltage at sensing probe 10 is rectified and filtered by element 30, amplified by element 80 and compared to a reference value by comparator 90 which provides a corresponding logic detection signal. The on and off logic signal represents absence or presence of the detected object.

An alternative to eddy current probes, such as described above, are magnetic reluctance probes which are used to detect the presence of a ferrous (permeable) object. Such probes are formed of a magnetically biased solenoid coil with an open magnetic structure designed to be influenced by a magnetic object which passes by a fluxed gap. The AC voltage generated in a magnetic reluctance probe is a function of the proximity of the probe to the moving magnetic object, a function of its relative permeability and a function of its velocity relative to the sensing probe. A disadvantage of magnetic reluctance probes is that the magnetic object must be moving for the magnetic reluctance probe to sense its presence. Furthermore, at low relative velocities, the output of a magnetic probe is very low (in the mV range) and can be subject to interference from a variety of external sources, both magnetic and electric.

Photoelectric position sensors also are used as an alternative to eddy current probes. Photoelectric positions sensors operate in either a reflective or transmissive mode; that is, as an optical beam interruptor or as a reflective object sensor. In either embodiment, the relative sensitivity to dirt contamination and limited temperature operating range of photoelectric position sensors precludes their use in most outdoor, industrial or automotive applications.

Hall effect sensors can also be used as an alternative to eddy current probes for certain applications. Hall effect sensors are responsive to a bias field from a magnet. Unlike eddy current sensors a magnetic bias field is required and unlike magnetic reluctance probes the magnetic bias field does not have to be moving to sense its presence. Hall effect sensors would not be considered for use in certain applications because they have disadvantages when used in less refined conditions such as industrial or automotive conditions. Hall effect sensors use a permanent magnet that will pick up metal fillings and clog the stand-off space between the sensor and the object to be sensed. Additionally, Hall effect detectors require a smaller stand-off space than eddy current probes which further compounds problems with metal fillings or dirt which will clog the stand-off space. Also, a smaller stand-off space increases alignment problems beyond tolerable limits. Furthermore, Hall effect sensors are susceptible to temperature drift and are incapable of operating at elevated temperatures.

Only eddy current probes, photoelectric position sensors and Hall effect sensors can be used at very low sensing velocities. Magnetic reluctance probes can not be used at low sensing velocities because the magnetic object must be moving for the magnetic reluctance probe to sense its presence. Eddy current probes, photoelectric position sensors and Hall effect sensors qualify as "zero speed sensors" because no relative movement is necessary for their operation.

Certain applications require zero speed sensing. One such application is wheel rotation sensing for anti-lock braking systems and traction control systems. Wheel rotation is a critical parameter in these applications and is an indication of brake lock-up or tire slippage.

Figure 2:
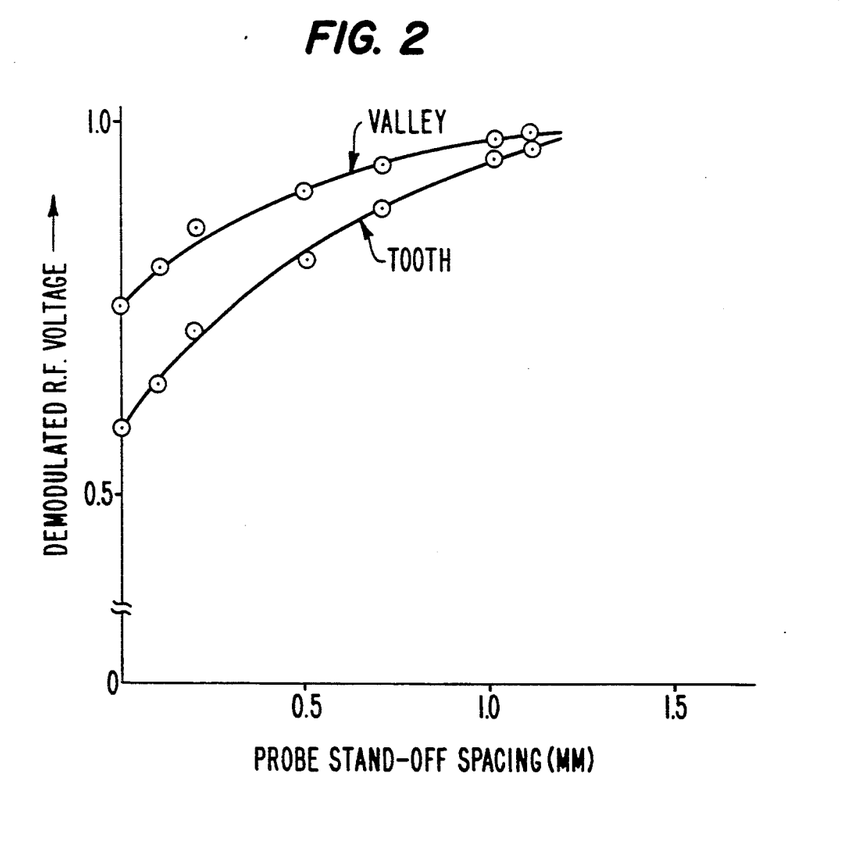
FIG. 2 is a graph showing the output signal characteristic of a conventional eddy current probe for various stand-off spacings.

FIG. 2 shows a graph of the output characteristics of a conventional eddy current probe sensing a ferrous toothed disc. It can be seen from the graph that as the probe stand-off spacing becomes greater, the signal differential between sensed teeth and valleys of the toothed disc is apparent.

In typical use, a stand-off spacing of about 1 millimeter (0.04 inches) probably is as close as one would want the probe to be located adjacent the toothed disc. Environmental considerations such as dirt, water and vibration tend to favor greater stand-off spacing, but the differential signal level (tooth to valley) approaches residual electronic noise levels with greater stand-off spacing. Also, any tendency of the sensor to move with respect to the disc causes the creation of interference signals, as would any out of roundness of the disc. Disc out of roundness or misalignment also causes a superimposed low frequency sinewave DC offset component on the output signal. Offset variations on the output signal can also occur from temperature induced drifts, normal aging of circuit components in addition to unwanted spacing variations, vibration and slow changes in circuit gain and offset.

The need for a solution to offset problems in eddy current detectors has existed for many years and has heretofore been unsolvable by eddy current sensor artisans. In the present invention, an eddy current detector detects an object with the compensation to compensate for variations including stand-off spacing, misalignment, temperature drift and aging of components.

SUMMARY OF THE INVENTION

The present invention provides an eddy current detector circuit which solves the problem of DC bias and offsets yielding advantages and features over prior eddy current detectors not heretofore possible.

In accordance with the present invention, a RF oscillator provides signals for inducing eddy currents in an object to be measured. Alterations, such as teeth on a disc for example, in the object are detected as eddy current signals sensed by an eddy current probe. The present invention separates alteration current signals from offset currents in the eddy current signal to aid in discriminating levels in the alteration current signals. The alteration currents can be separated from the offset currents by AC coupling with a high pass filter or separated by a microprocessor as part of a data processing detection routine.

An important object of the present invention is to provide an eddy current detector immune to DC bias and offsets.

Another object of the present invention is to provide an eddy current detector which AC couples detecting circuitry to an eddy current probe.

Another object of the present invention is to provide an eddy current detector immune to stand-off spacing.

Another object of the present invention is to provide an eddy current detector immune to variations, temperature drifts and aging of components.

Another object of the present invention is to provide an eddy current detector with a high pass filter on the output of an eddy current probe prior to detection for increasing the differential signal level between alterations on a surface to be detected.

A further object of the present invention is to provide an eddy current sensor which can provide the above objects and features using digital data processing in a microprocessor.

DETAILED DESCRIPTION OF THE PREFERRED EMBODIMENTS

Figure 3:
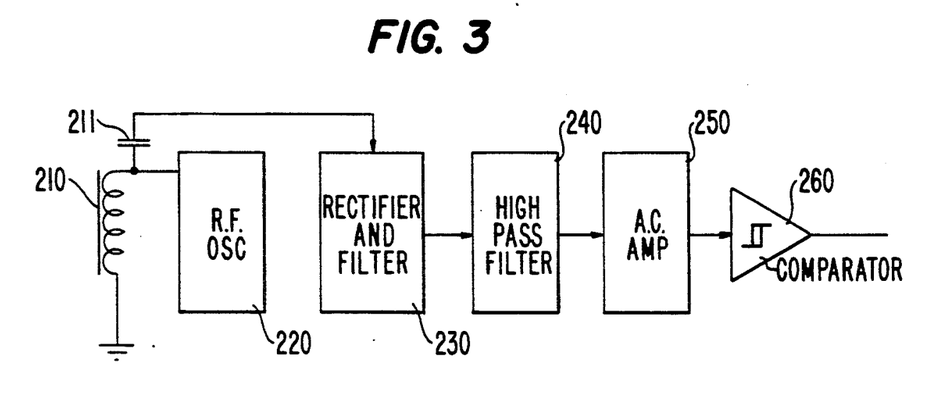
FIG. 3 is a schematic block diagram of a first embodiment of the present invention for detecting alterations in a sensed eddy current signal using a high pass filter for AC coupling.

FIG. 3 shows a schematic block diagram of a first embodiment of the present invention. RF oscillator 220 connects to probe 210 and induces an eddy current in a conductor. Rectifier and filter 230 receives sensed eddy currents in the conductor measured by eddy current probe 210 coupled through capacitor 211. Rectifier and filter 230 detect the signal by rectification and filtering the signal for noise reduction. The recovered DC signal is then capacitively coupled through high pass filter 240. High pass filter 240 is formed of capacitor C and a resistor R wherein the transfer characteristic is:

$$f = (1*pi*RC)$$

where f is the frequency at which the response is 3dB down and Pi is 3.14159.

Filtering the analog recovered output signal removes DC bias or offsets due to changes in sensor to conductor stand-off spacing. For instance, the bias in offset errors due to stand-off spacing, shown in FIG. 2, are eliminated. With the 3 dB point at approximately 1.5 Hz, signals of frequencies as low as 1 Hz are easily detected by comparator 260 and are merely attenuated to approximately 40% of their initial value. The AC coupled signal output of high pass filter 240 is amplified in AC amplifier 250. The analog output level of AC amplifier 250 is then fed to level comparator 260. Level comparator 260 preferably has hysteresis in order to develop digital pulses which correspond to alterations on the conductor. The hysteresis prevents chatter and allows detection of the alteration signals which have a voltage level different than non-alteration signals. Alternatively, level comparator 260 can be replaced with, for example, a zero crossing detector.

After removal of DC bias and offset by high pass filter 240 and amplification in AC amplifier 250, relatively small changes in eddy currents are easily detected.

Figure 4:
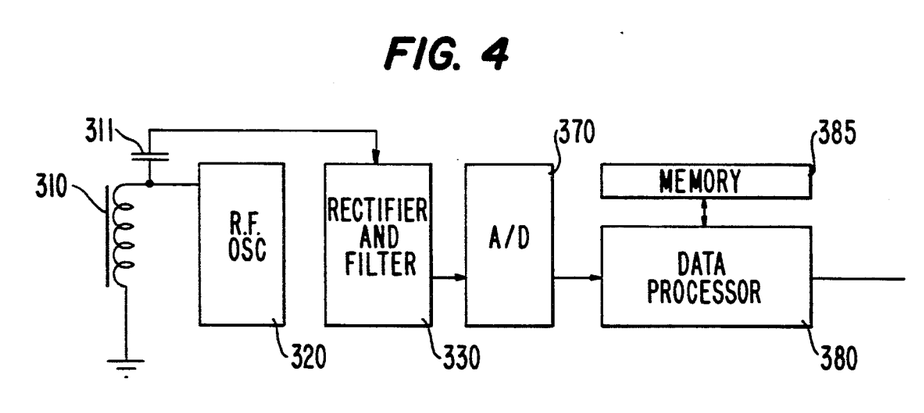
FIG. 4 is a schematic block diagram of a second embodiment of the present invention wherein a microprocessor performs digital data processing and detects alterations in a sensed eddy current signal similar to that performed in the first embodiment of FIG. 3.

FIG. 4 shows a schematic block diagram of a second embodiment of the present invention wherein data processor or microprocessor 380 digitally filters and detects sensed eddy current signals. A "vote" is taken as part of the digital filtering calculations but is not necessary for digital filtering. As described before, RF oscillator 320 induces eddy currents in the conductor through eddy current probe 310. Rectifier and filter 330 receive eddy currents sensed in the conductor by eddy current probe 310 coupled through capacitor 311. Analog-to-digital (A/D) converter 370 receives the rectified and filtered output signal from rectifier and filter 330 for conversion from a DC signal to a sampled preferably eight bit digital signal. Microprocessor 380 analyzes the sensed eddy current signal converted by analog-to-digital converter 370. Microprocessor 380 includes memory 385 as well as all other conventional components required for computation, such as clocks and input/output buffers. Microprocessor 380 analyzes the sensed eddy current signal by storing, summing and selecting samples over time. It can then be determined if the sensed eddy current signal is changing in a repeatable or periodic manner. Peaks in the sensed eddy current can also be detected as well as, alternatively, zero crossings. Summing or counting when filtering the sensed peaks or zero crossings over a set number of counts or a set time period is possible in analyzing the data. When certain criteria are met, the microprocessor can output meaningful data results based on the analyzed data. For instance, peak values of the sensed eddy current signal can be detected and the analog level of the values converted in a table to a meaningful result such as measured miles per hour (MPH).

The above analysis in the data processor performs high pass filtering in effect by allowing peaks or zero crossings in a periodic repeatable manner to be detected.

It may further be desirable to implement an additional routine in microprocessor 380 which performs digital filtering on the signal sent from analog to digital converter 370. This digital filtering could be performed by known digital filtering routines and act as a high pass filter prior to detection of peaks, zero crossings or other indications of alterations on the surface of the conductor. Such an additional filtering routine is unnecessary in the present invention because the low frequency signals processed in the preferred use of the invention are typically in the 0 to 10 Hz band.

Figure 5:
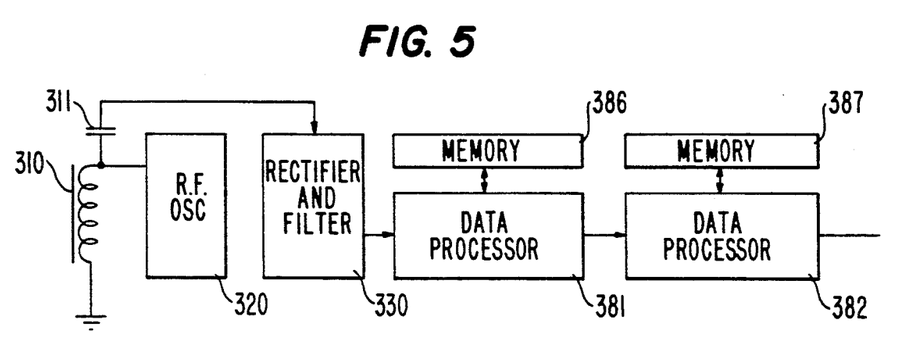
FIG. 5 is a schematic block diagram of the second embodiment of the present invention wherein digital processing tasks are divided among two microprocessors.

As shown in FIG. 5, it may also be desirable to use two digital data processors or microprocessors 381, 382, one 381 for digital filtering followed by another 382 for data analysis. In this arrangement, the data processors can be more dedicated to their particular tasks and have individual clock rates more suitable for their particular functions.

Figure 6:
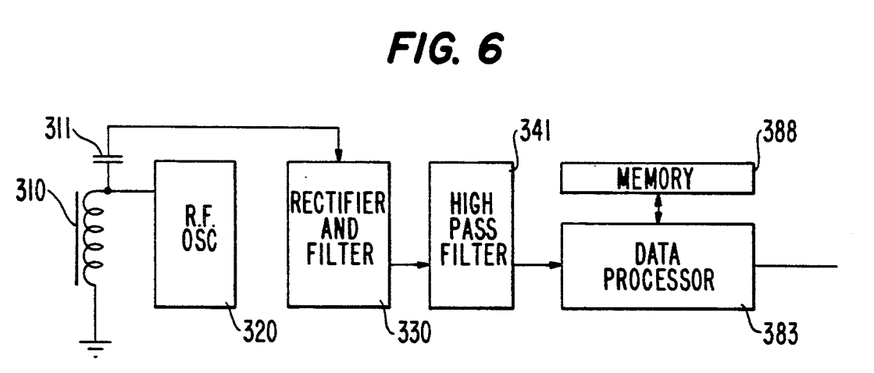
FIG. 6 is a schematic block diagram of the second embodiment of the present invention wherein analog AC coupling is performed prior to digital data processing and the detection of alterations.

As shown in FIG. 6, it may additionally be desirable to use analog AC coupling 341 on the input of digital data processor or microprocessor 383 instead of or in addition to performing AC coupling by digital filtering in the microprocessor.

As microprocessors become more common in measuring in control equipment, it will become more economical to implement the data processing embodiment of FIG. 4 rather than the analog embodiment of FIG. 3. In the prior art, an artisan would have had to connect the output of the current detector of FIG. 1 to a data collection device such as a microprocessor. Given the present invention, DC biases and offset can now be removed and less hardware required since the detection and/or filtering can now be performed by digital components already present in the measurement system.

Figure 7:
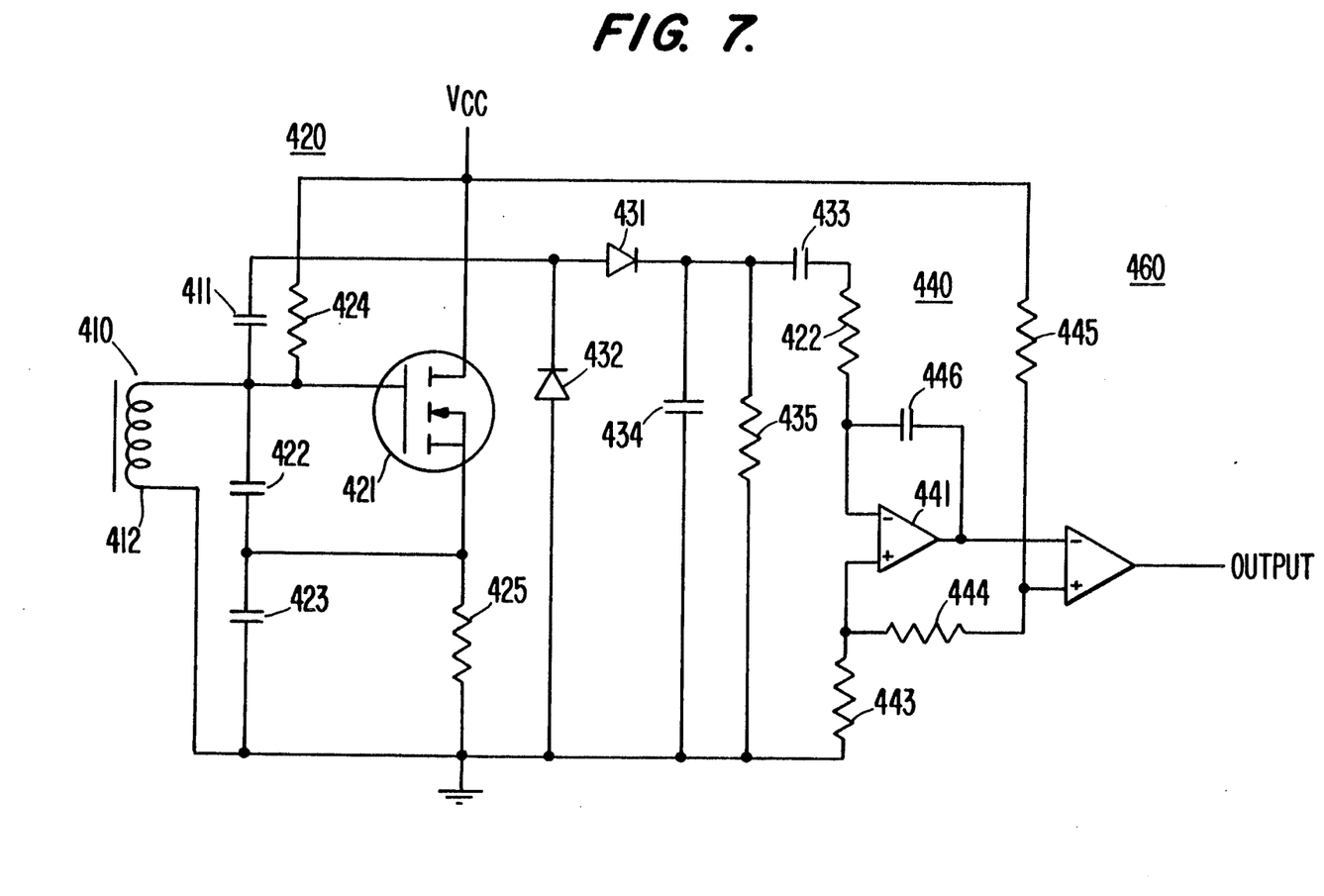
FIG. 7 is a detailed schematic diagram of a circuit for implementing the first embodiment of the present invention.

FIG. 7 shows a detailed schematic diagram of circuitry for the first embodiment of the present invention. Eddy current probe 410 is connected to MOS-FET transistor 421. Eddy current probe 410 is a typical eddy current sensor commerically available from Electro Corporation, Kaman Sciences or Bently Nevada Corporation. MOS-FET transistor 421 is used as a Colpitts oscillator, oscillating preferably at 500 kHz and is powered from the Vcc line through resistor 424. Coil 412 in sensing probe 410 acts as the tank inductance as well as the sensing probe. Coil 412 in sensing probe 410 in conjunction with capacitors 422 and 423 provides the LC circuit necessary for oscillation in the Colpitts oscillator. Capacitors 422 and 423 operate in series forming a voltage divider that serves to match the input and output impedance of Colpitts oscillator 420. A small portion of the RF signal is sampled from tank inductor 412 through capacitor 411 and is rectified and filtered by diodes 431 and 432, capacitor 434, and resistor 435. This produces the DC eddy current signal at a level proportional to the amplitude of the RF signal. High pass filter network 440 then attenuates DC bias and offsets while passing changing signals. High pass filter network 440 is comprised of resistors 442 and capacitor 433. Preferably, high pass filter network 440 is followed by amplifier 441 having a nominal gain of 220 with high frequency roll off capacitor 446 in the feedback loop to attenuate any residual R.F. The output of high pass filter network 440 and amplifier 441 connects to an amplifier configured as comparator 460. Comparator 460 has hysteresis built in and can swing nearly to the supply rail thereby yielding a stable, interference free signal. The setpoint at the non-inverting input of comparator 460 is set at a nominal value (say 200 mV) above the zero signal output level of high pass filter network 440 to provide noise immunity. The non-inverting inputs of amplifier 441 and comparator 460 are set by the voltage divider network formed of resistors 443, 444 and 445.

Figure 8:
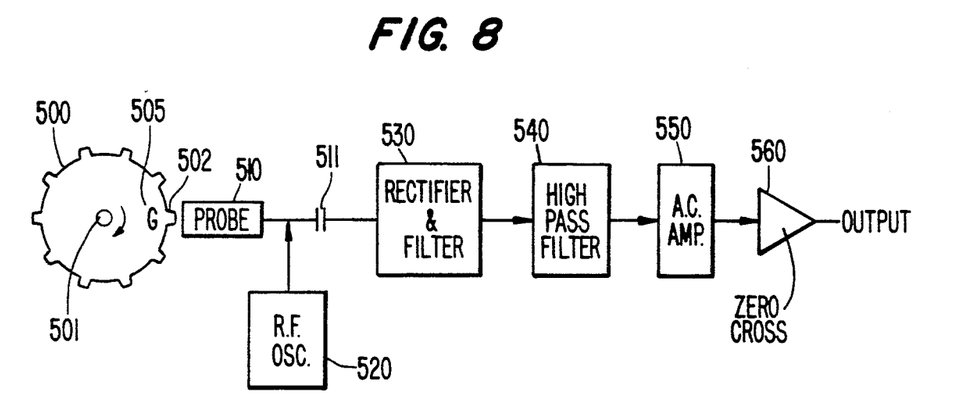
FIG. 8 shows a preferred use of the present invention for sensing the condition of rotation of a disc by sensing alterations at and between teeth on the disc.

FIG. 8 shows a schematic block diagram of the present invention connected in its preferred use as a detector for the rotation condition of disc 500. As disc 500 rotates about axis 501, teeth 502 are detected by eddy current probe 510. Oscillator 520 induces eddy currents 505 in disc 500 via eddy current probe 510. The eddy currents 505 in disc 500 are also detected by eddy current probe 510. The detected eddy current signal at probe 510 has a greater magnitude when teeth 502 are in closer proximity to eddy current probe 510. The sensed eddy current signal is coupled through capacitor 511, and rectified and filtered at 530. Additionally, in accordance with the present invention, high pass filter network AC couples the detected eddy current signal and AC amplifier 550 amplifies the detected signal. Finally, zero crossing detector 560 indicates the condition of rotation of disc 500 in accordance with the proximity of teeth 502 as they move and rest about eddy current probe 510.

In the preferred use, less tooth samples per unit time are present at slower disc rotation speeds than at high disc rotation speeds. This can pose a problem when at slower speeds, not enough samples are available to gather reliable data or at higher speeds too many samples are present per unit time to be processed by suitable digital components.

Figure 9:
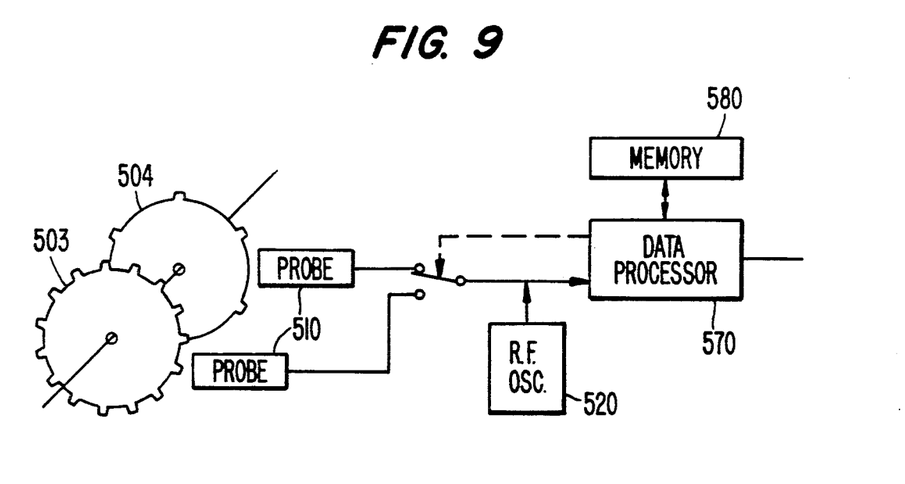
FIG. 9 shows a preferred use of the present invention for sensing the condition of rotation of more than one disc.

One solution to this problem is shown in FIG. 9. More than one toothed disc 503, 504 are used with varying numbers of teeth on each disc. The detecting circuitry can then switch its input between the discs to optimize the number of samples based on the rotation speed.

Another solution to this problem is to use a divide by circuit on the output of the eddy current probe or on the output of the AC coupling/filter. The divide by circuit can be enabled when the toothed disc is at faster rotation speeds and disabled when at slower rotation speeds.

Figure 10A:
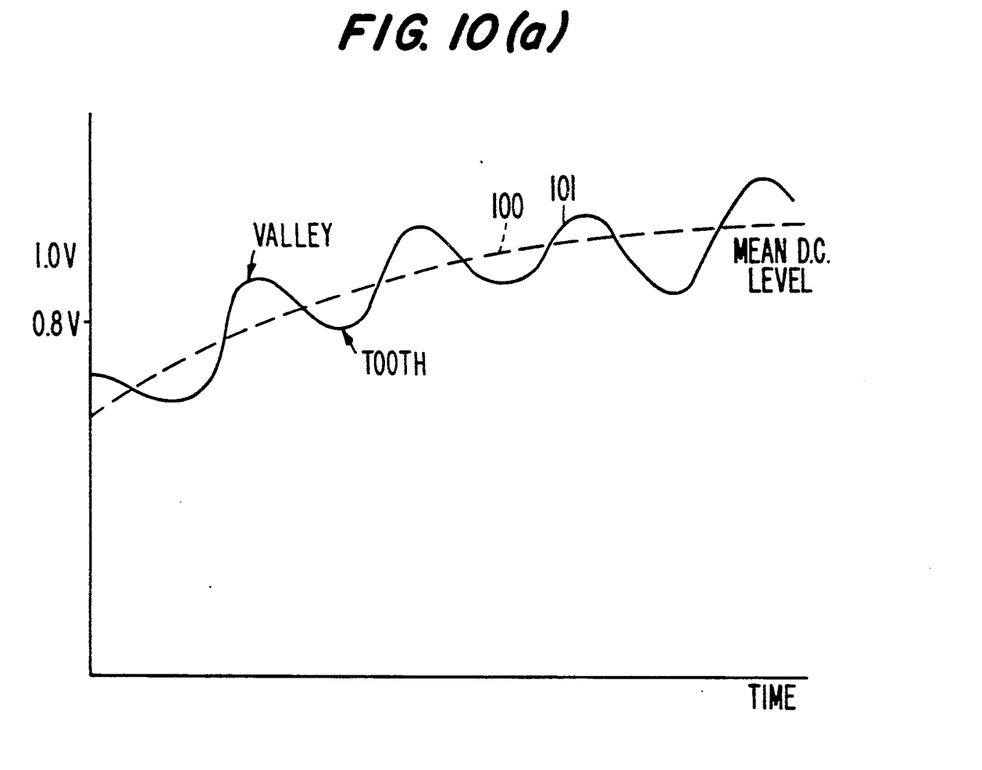
FIG. 10(a) is a waveform diagram illustrating an eddy current signal sensed by the eddy current probe of FIG. 8.

The operation of the invention shown in FIG. 8 will now be described in conjunction with the graphs of FIGS. 10(a) through 10(c). FIG. 10(a) is a graph of the eddy currents in disc 500 sensed by eddy current probe 510. An inherent DC offset 100 can be seen present in this preferred use of the present invention. Sensed eddy current signal 101 rides on DC offset voltage 100 which may be more than an order of magnitude greater than the peak value of the varying sensed eddy current signal 101. Also, DC offset 100 is not always a constant level offset but can slope and waver over time. This may be due to disc 500 being out of round or axis 501 being imperfectly centered at the disc's center. In such a condition, the stand-off spacing between teeth 502 and the tip of eddy current probe 510 would waver closer and farther as disc 500 rotates and a sinewave DC offset would be present with the sensed eddy current signal 101 riding thereupon.

Figure 10B:
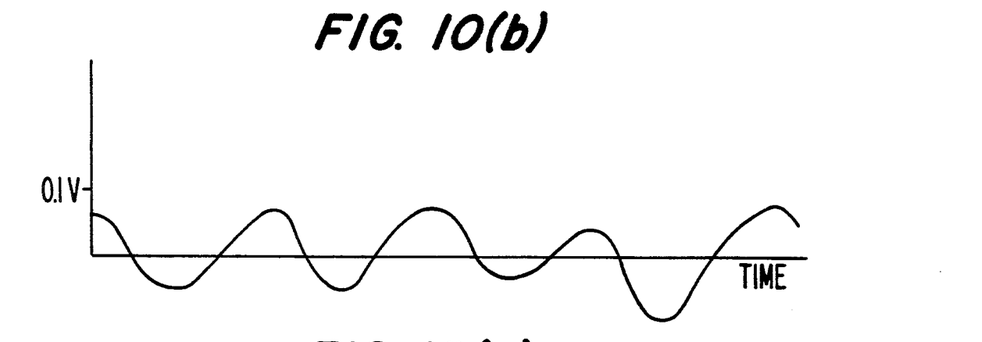
FIG. 10(b) is a waveform diagram illustrating the sensed eddy current signal with drifts and offsets removed after AC coupling by a high pass filter.

FIG. 10(b) shows a graph of the sensed eddy current signal after it is AC coupled by high pass filter 540. The low frequency DC bias and offsets such as the out of round sinewave 101 are eliminated by the AC coupling of high pass filter 540. Reliable indication of the condition of rotation of disc 500 is then possible by zero crossing detector 560 indicating when the AC coupled eddy current signal shown in FIG. 10(b) crosses zero, thus indicating the edge of a tooth 502 on disc 500.

Figure 10C:
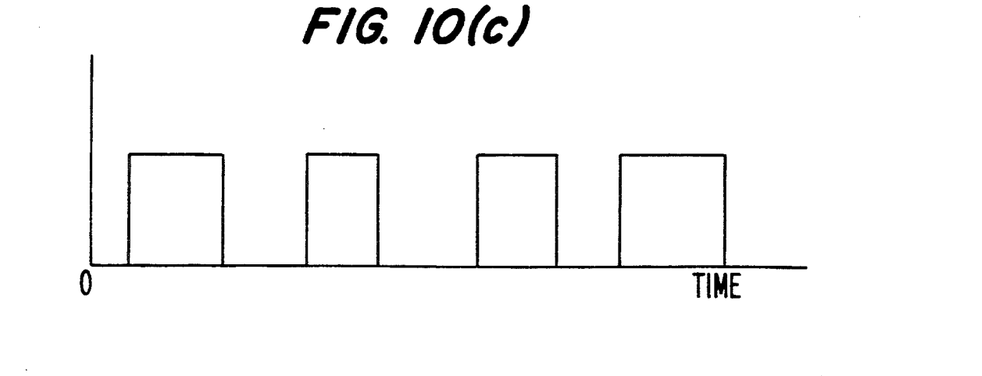
FIG. 10(c) is a waveform diagram illustrating the pulse output of a zero cross detector applied to the waveform of FIG. 10(b).

FIG. 10(c) indicates the condition of rotation of disc 500 output of zero crossing detector 560. Zero crossing detector 560 regenerates signals corresponding to teeth 502 respective of the relevant amplitudes, thus showing only slight variations and output pulse width. These changes in output duty cycle may be easily eliminated by an additional output stage monostable (not shown) which would deliver fixed duration pulses of variable frequency as a function of tooth disc rotation rate.

Figure 11:
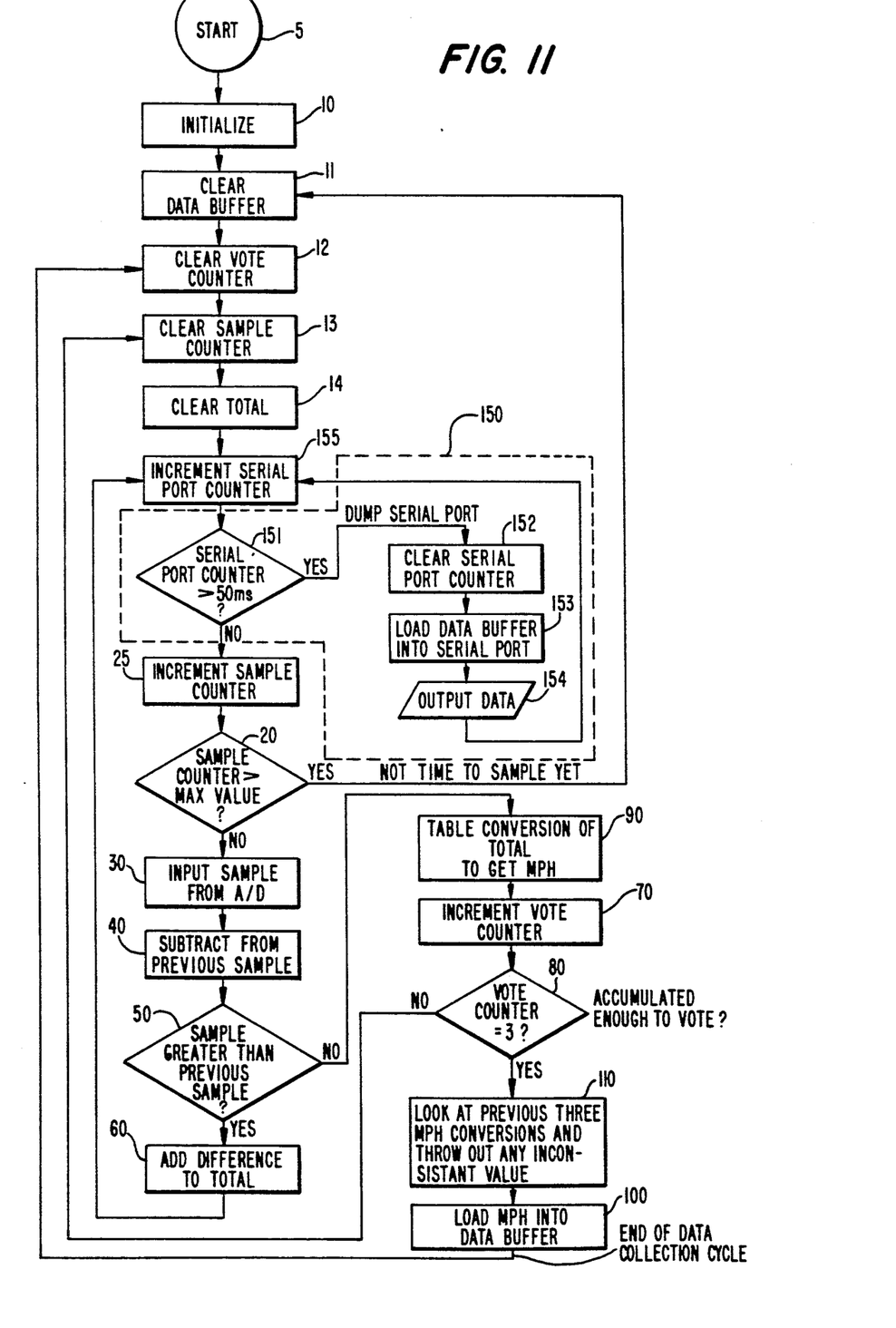
FIG. 11 is a flowchart showing the preferred operation of a microprocessor.

FIG. 11 shows an exemplary flow chart of the data analysis performed by data processor or microprocessor 380. After start 5, data buffers 11-14 are cleared and prepared for operation. Thereafter, the sample counter is incremented at 25 and a check is performed at 20 to insure the sample counter has not reached a maximum value. If this is the case, it is not time to sample and the routine returns to the beginning wherein buffers 11-14 are cleared. Otherwise, the sample counter is ready and an input sample is taken from the analog-to-digital (A/D) converter in block 30. The sample taken in block 30 is compared with the previous sample taken in the previous cycle through block 30. Comparison is performed by subtracting the present sample from the previous sample value. As in block 50, if the present sample is greater than the previous sample, the difference of the present sample subtracted from the previous sample value is added to the total for a data summation in block 60. Otherwise, when the present sample is not greater than the previous sample, it is probable that a stable level has been reached. Under this condition the total value summed in block 60 is converted in block 90 to miles per hour (MPH) data in a look up table. Thereafter, the vote counter is incremented in block 70. After the vote counter as been incremented in three subsequent passes through the loop where the present sample is not greater than the previous sample (less than or equal to), enough data has then been accumulated to take a vote. Control can then pass through block 80 to block 110 where a vote is taken. In block 110, a vote is taken by looking at previous MPH conversions and throwing out any value that is inconsistent with the other values. Control is then passed to block 100 where the MPH data selected in block 110 is stored in the data buffer. At this point the end of data collection cycle has been achieved and control is passed back up to block 12. If enough data has not been accumulated at block 80 to take a vote, control passes from block 80 to block 13 where the sample counter is cleared and new samples are taken. Eventually when enough samples are taken to take a vote, the selected miles per hour data is stored as before in the data buffer.

When detecting the rotation condition of the toothed disc in the preferred use, at slow speeds of rotation it is desirable a vote not be taken. In such an instance the vote counter is not used nor incremented in block 70. The total values summed in block 60 are then all converted to miles per hour 90 and loaded into the data buffer at 100 when the present sample is not greater than the previous sample at 50. Not taking a vote improves the data throughput of the routine at slow speeds. A softswitch can be used to enable and disable the vote based on the detected condition of rotation of the disc.

Output loop 150 can also be added to the routine of FIG. 8. Output loop 150 operates best when performed prior to incrementing the sample counter at 25. In output loop 150, the serial port is output (or dumped) when serial port counter 155 reaches a value greater than preferably 50 ms. When outputting, the serial port counter is cleared at 152, the data buffer is loaded into the serial port at 153 and data is output through serial port 154.

The routine of FIG. 11 allows a summation of sample values in the total register and a conversion of sensed sample counts over time to derive mile per hour data. By monitoring the total register or the mile per hour data in the data buffer the condition of alterations on an object can be determined at a given time. The routine described along with FIG. 11 is exemplary and certain variations are possible. For instance, zero crossings maybe detected in the alternative to peaks. Such routines can be implemented given the basics shown in FIG. 11. Also, filtering and averaging schemes other than the filtering and averaging scheme of FIG. 8 are possible such as those operating on signals thresholded at particular levels.

Sensed eddy current signals riding on DC offset voltages would be extremely difficult to accurately detect without the removal of the effect of the offset by the AC coupling in the high pass filter of the first embodiment or the data processing routine in the microprocessor of the second embodiment. Given the present invention, drifts in offset due to out of roundness of a disc as in the preferred use of FIG. 6 or other variations such as temperature drift aging of component values or stand-off spacing variations in other application are eliminated. The present invention provides a simple remedy for these problems and, furthermore, provides cost savings by allowing integration of the eddy current sensor with microprocessor components for digital data processing which may already be present and available for use in existing measurement and control environments.

While the invention has been illustrated and described in detail in the drawings and foregoing description it will be recognized that changes and modifications can and will occur to those skilled in the art. It is therefore intended by the appending claims, to cover any such changes and modifications as fall within the true spirit and scope of the invention.

What is claimed is:

1. An eddy current detector capable of detecting a condition of movement of an object having surface variations, said detector comprising:
   a sensing probe adapted to be aligned to said object for inducing eddy currents in said object and sensing said eddy currents and providing a corresponding sensing signal;

an RF oscillator coupled to said sensing probe for providing current for inducing said eddy currents in said object;

demodulating means coupled to said sensing probe for demodulating said sensing signal;

separating means for separating out any components of said sensing signal caused by said surface variations;

said separating means including:
  a) a high pass filter coupled to said demodulating means for filtering an output of said demodulating means;
  b) an amplifier coupled to said high pass filter for amplifying an output of said high pass filter; and
  c) a high frequency roll-off capacitor coupled to said amplifier and located in a feedback loop of said amplifier for attenuating any residual RF components in said sensing signal; and discriminating means coupled to said separating means for discriminating the level of said sensing signal to indicate the present of said surface variations.

2. The eddy current detector of claim 1, wherein said high pass filter has a roll-off near the frequency of sensed eddy currents.

3. The eddy current detector of claim 1 further comprising switch means for selecting a desired data rate of sensing said eddy currents per unit time, said selection being dependent upon said condition of movement of said object.

4. An eddy current detector capable of inducing an eddy current signal in a region of a conductor and detecting surface variations of said conductor over time by detecting changes of said eddy current signal in said region of the conductor, comprising:

oscillator means for providing RF signals to induce in said conductor;

probe means coupled to said oscillator means for inducing said RF signals in said conductor to produce eddy currents;

sensing means coupled to said probe means for sensing said eddy currents induced in said conductor and providing a corresponding sensing signal;

separating means coupled to said sensing means for separating out any high frequency components of said sensing signal caused by said surface variations from lower frequency components sensed by the sensing means;

said separating means including:
  a) a high pass filter coupled to said demodulating means for filtering an output of said demodulating means;
  b) an amplifier coupled to said high pass filter for amplifying an output of said high pass filter; and
  c) a high frequency roll-off capacitor coupled to said amplifier and located in a feedback loop of said amplifier for attenuating any residual RF components in said sensing signal; and discriminating means for discriminating levels in said sensing signal to indicate the occurrence of said surface variations.

5. The eddy current detector of claim 4, wherein said high pass filter has a roll-off near the frequency of sensed eddy currents.

6. The eddy current detector of claim 4 further comprising switch means for selecting a desired data rate of sensing said eddy currents per unit time.

* * * * *